United States Patent [19]
Hunter, Jr. et al.

[11] Patent Number: 5,514,618
[45] Date of Patent: May 7, 1996

[54] PROCESS FOR MANUFACTURE OF FLAT PANEL LIQUID CRYSTAL DISPLAY USING DIRECT LASER ETCH

[75] Inventors: Robert O. Hunter, Jr., Rancho Santa Fe; Chester A. Farris, Yorba Linda, both of Calif.

[73] Assignee: Litel Instruments, San Diego, Calif.

[21] Appl. No.: 395,494

[22] Filed: Feb. 23, 1995

[51] Int. Cl.⁶ .................................................. H01L 21/786
[52] U.S. Cl. ........................... 437/60; 437/174; 437/181; 437/246; 437/247; 148/DIG. 1
[58] Field of Search ................................ 437/60, 51, 919, 437/40, 41, 246, 181, 174; 148/DIG. 150

[56] References Cited

U.S. PATENT DOCUMENTS

| | | | |
|---|---|---|---|
| 4,646,424 | 3/1987 | Parks et al. | 437/40 |
| 5,130,772 | 7/1992 | Choi | 257/72 |
| 5,231,039 | 7/1993 | Sakono et al. | 437/41 |
| 5,362,940 | 11/1994 | MacDonald et al. | 219/121.68 |
| 5,364,493 | 11/1994 | Hunter, Jr. et al. | 156/630 |
| 5,367,392 | 11/1994 | Janai | 257/72 |

*Primary Examiner*—Tom Thomas
*Assistant Examiner*—Michael Trinh
*Attorney, Agent, or Firm*—Townsend and Townsend and Crew

[57] ABSTRACT

A direct laser ablation process is disclosed for forming thin film transistors on liquid crystal matrix for enabling typically color presentation from a flat panel display. The thin film transistor is of the type having an active matrix addressing scheme wherein a capacitor when charged turns on and maintains in the "on" state a field effect transistor to permit passage of light through a liquid crystal display. All patterning of the display is done either by utilizing deposition, direct ablation of an etch block followed by etching, or more preferably deposition followed by direct laser ablation. In the preferred embodiment, aluminum channels are made by deposition followed by a direct laser ablation. Anodizing follows with deposition of a silicon-nitrogen layer. With respect to the capacitor, indium tin oxide is deposited to complete a matrix capable of selectively strobing and charging the capacitor for each matrix element. Local photo deposition of amorphous silicon in a gas carrier occurs under focused laser light occurs followed by laser annealing to form the required polycrystalline state. A chrome interface layer is sputter coated followed by direct laser etch. An aluminum cap is added for providing power conduction to the complete NPN transistor. Utilizing the precision of direct laser processing, a display can be fabricated with acceptable yield due to the reduced number of process steps. The remainder of the LCD display is conventional including filter material placement and panel assembly.

8 Claims, 5 Drawing Sheets

PROCESS FOR MANUFACTURE OF FLAT PANEL LIQUID CRYSTAL DISPLAY USING DIRECT LASER ETCH

BACKGROUND OF THE INVENTION

The manufacture of large area flat panel displays (LCD, STN, AMLCD) is a difficult and costly process. To a great extent manufacturing resembles that of VLSI (very large scale integration) integrated circuit manufacturing. It is a process intensive environment dominated by lithography, deposition and etch. Like semiconductor manufacturing, process control and defect density are crucial factors in terms of yield and ultimately cost.

Multichip modules (MCMs) represents somewhat of a halfway point between large area displays and VLSI. Like VLSI, MCMs are process intensive, defect limited technologies like large area displays (LAD). MCMs typically have much fewer "die" and require much higher yields on a per area basis than integrated circuits.

The ability to manufacture, at reasonable costs, large area display is an enabling capability. Many products that are technically feasible today have not been exploited primarily due to the high cost of the display.

An economic thin film transistor (TFT) display could potentially solve these problems. The TV and computer markets alone represent an opportunity for as many as twenty million displays annually. This estimate is very conservative if existing yield and cost issues can be overcome.

Liquid Crystal Displays

There are many ways to make LCD displays. Among these are the twisted-nematic (TN-FE), the electronically controlled birefringent, supertwisted birefringent mode interference effect (STN), and surface stabilized ferroelectric. TN-FE displays are the oldest and lowest-cost liquid crystal displays. However, they demonstrate the poorest performance when used in a highly multiplexed mode. SBE displays offer a substantial improvement. Supertwisted-nematic (STN) displays are rapidly replacing TN displays in large area, high information content display applications. Ferroelectric-smectic displays are the subject of significant research and however, pose many difficulties in manufacturing.

Multiplexed TN-FE Display

The first liquid crystal displays were used for watches and clocks, before higher information content dot matrix displays arrived. The direct multiplexing technique was developed to allow the addressing of large numbers of pixels in matrix format. Multiplexing puts a greater demand on the liquid crystal material. It must respond quickly and have a sharp response threshold in order to produce a high quality image.

Changes in alignment under electric field change the optical characteristics of the material, making the display of information possible.

An actual high information content display consists of rows and columns of electrodes connected to drivers that supply voltage. In operation, the display is scanned row-by-row from top-to-bottom at 60 to 100 Hz. The liquid crystal reacts to the average of the voltage over time.

LCDs could not be used widely in portable computer applications until the display quality was improved substantially. Two prime features, low power and compactness, overshadowed the poor appearance, and LCDs showed up in a few products that made a brief debut in the early markets for portable products. The first of these enhanced displays was called supertwisted LCDS, and the next wave was the active matrix addressed LCDs. Users were accustomed to CRTs with good resolution and color. It became clear that consumers would not accept, in broad markets, displays with poorer contrast and no color.

The standard technique for developing color is to use a filter layer inside the cell. The filter must be used in conjunction with a backlight, and the backlight must be white. A powerful backlight must be used due to the low light transmission of the color. However, color without good contrast and viewing angle was still not adequate to achieve market acceptance. In addition, color proved to be difficult to produce and still quite expensive. In order to meet consumer demands for high information displays, full color, good contrast and viewing are essential. In an attempt to meet consumer expectations, experts in the industry devised active matrix display technology.

Active matrix addressing is a technique for enhancing the addressing and writing of dot matrix displays. Multiplexing uses the timing of the signals to select and write a particular line of the display. As more and more lines are written, the amount of time the controller can spend writing to each individual line (the duty cycle) decreases. Eventually, the liquid crystal does not have time to react fully and contrast diminishes. When addressing the display is separated from the writing, each line can be written quickly and can maintain its image. Separation of addressing and writing has been attempted by several methods.

Active matrix refers to an addressing technique in which a writing voltage is switched by the addressing matrix. Other types of enhancements have been developed and some of these are often grouped into the active matrix category. Some are diode matrix, MIM, varistors, and so on. The goal always is to produce a better display at lower overall cost per unit.

Active matrix LCDs are particularly well suited for color. Most of the active matrix products under development or in manufacturing include color. Monochrome active matrix LC displays benefit from a much lower power consumption than color, saving on battery size and weight. Customers now expect to have color, or at least a backlit display.

Color filers are added to the inside of the LC cell. Filters are arranged in a quad, triangular or striped pattern that mimics the way color is developed on a CRT. An individual pixel can be comprised of three or four subpixels, each independently controlled to halftone capability and is required to achieve more than eight basic colors.

Unfortunately, active matrix addressing makes the display hardware more complex by adding a switch to each pixel. The switch can be turned on very rapidly (in a few microseconds) and a storage capacitor can then be used to maintain its condition while the other lines are being written. Several approaches to making switches have been used. These include diodes, varistors, transistors, and various combinations thereof.

Thin film transistor (TFT) has emerged as the most successful technique for active matrix displays. The structure most suitable for video displays is a transistor and a capacitor located at each pixel. The colors, red, green, and blue, are developed by incorporating organic filters and backlighting the display.

Polysilicon is gaining in popularity as the limitations of amorphous silicon become more apparent. However, polysilicon is a high-temperature process and needs a relatively expensive substrate due to the recrystallizing process.

Amorphous silicon processing technology is in production at several facilities worldwide. Twenty years ago it was developed for low-cost solar cells. It is a low cost technology capable of being used for depositing the material over large areas. The combination of amorphous silicon and CMOS IC drivers satisfy most of the conditions for an active matrix LCD for video applications.

Unfortunately active matrix displays require a complex manufacturing process and reaching financial objectives has been difficult. Active matrix displays require processes similar to integrated circuit manufacturing.

SUMMARY OF THE INVENTION

A direct laser ablation process is disclosed for forming thin film transistors on liquid crystal matrix for enabling typically color presentation from a flat panel display. The thin film transistor is of the type having an active matrix addressing scheme wherein a capacitor when charged turns on and maintains in the "on" state a field effect transistor to permit passage of light through a liquid crystal display. All patterning of the display is done either by utilizing deposition, direct ablation of an etch block followed by etching, or more preferably deposition followed by direct laser ablation. In the preferred embodiment, aluminum channels are made by deposition followed by a direct laser ablation. Anodizing follows with deposition of a silicon-nitrogen layer. With respect to the capacitor, indium tin oxide is deposited to complete a matrix capable of selectively strobing and charging the capacitor for each matrix element. Local photo deposition of amorphous silicon in a gas carrier occurs under focused laser light occurs followed by laser annealing to form the required polycrystalline state. A chrome interface layer is sputter coated followed by direct laser etch. An aluminum cap is added for providing power conduction to the complete NPN transistor. Utilizing the precision of direct laser processing, a display can be fabricated with acceptable yield due to the reduced number of process steps. The remainder of the LCD display is conventional including filter material placement and panel assembly.

BRIEF DESCRIPTION OF THE DRAWINGS

FIG. 4A a glass substrate having a one micron aluminum layer coated with etch block for direct patterning of the etch block followed by either wet or dry etch to produce a conductive matrix across the glass panel;

FIG. 4B is the same glass substrate with a silicon nitride coating illustrating the placement and direct ablation indium tin oxide for strobing and charging the capacitor;

FIG. 4C illustrates photo deposition of amorphous silicon from a gas carrier to locally deposit the transistor material; and, FIG. 4D illustrates completion of the overlying N-doped amorphous silicon layer by deposition from a gas carrier followed by local annealing to the polycrystalline state utilizing steps similar to the sequence of FIGS. 4C.

DESCRIPTION OF THE PREFERRED EMBODIMENT

Figure 1:
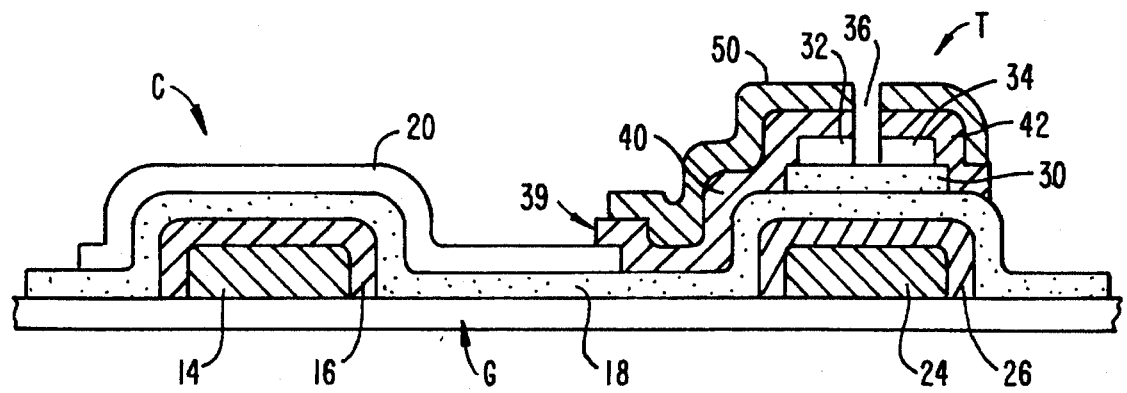
FIG. 1 is a side elevation section of an actively addressed capacitor/thin film transistor matrix element.

Referring to FIG. 1, glass substrate G is illustrated having thin film transistor T and capacitor C. As is well understood in the art, capacitor C is strobed. It maintains sufficient charge to keep thin film transistor T in the "on" state until strobing re-occurs. Thus, capacitor C functions as a crude memory device between the respective strobes. It will be thus understood that the display is of an active matrix variety.

Referring further to FIG. 1, capacitor C includes (about one micron) aluminum strip 14 having anodized coating 16. Likewise, thin film transistor T includes (about one micron) aluminum strip 24 covered by anodized coating 26. Both capacitor C and thin film transistor T have a coating of silicon nitride (SiNx) 18 covering the entire plate acting together with anodized coating 16 and anodized coating 26 as an insulating layer.

Completing capacitor C, indium tin oxide layer 20 covers capacitor C. Typically, strobing of capacitor C occurs through aluminum strip 14 and indium tin oxide layer 20. Aluminum strip 14 extends along one direction of glass substrate G. Indium tin oxide layer 20 extends along an opposite direction of glass substrate G. When the respective aluminum strip 14 and indium tin oxide layer 20 are coincidentally strobed, capacitor C retains charge. This retained charge maintains thin film transistor T in the "on" state for a sufficient interval until the next strobe occurs.

Thin film transistor T is of the NPN FET variety. It includes polycrystalline silicon transisting material 30. As will here after be fully developed, polycrystalline silicon transisting material 30 is first photo deposited from a carrier gas and thereafter changed from the amorphous state to the polycrystalline state with direct laser fluence. Similarly, N-doped silicon layers 32 and 34 are similarly deposited and treated so as to impart an NPN configuration with gap 36 forming the P link.

Conductive chrome layer 39 forms a conductive connection to capacitor C to enable the relatively small current from the capacitor to maintain thin film transistor T in the "on" state, this small current being conducted from indium tin oxide layer 20. Finally, capping aluminum strip 50 forms a driving current connection for thin film transistor T.

Operation is easy to understand. Capacitor C is strobed. If charged, indium tin oxide layer 20 turns on thin film transistor T. Thin film transistor T locally acts on standard LCD fluid permitting entry of light. Light enters into the particular pixel element—obtains the specific color of the pixel element—and the pixel is dominated by the color.

Figure 2:
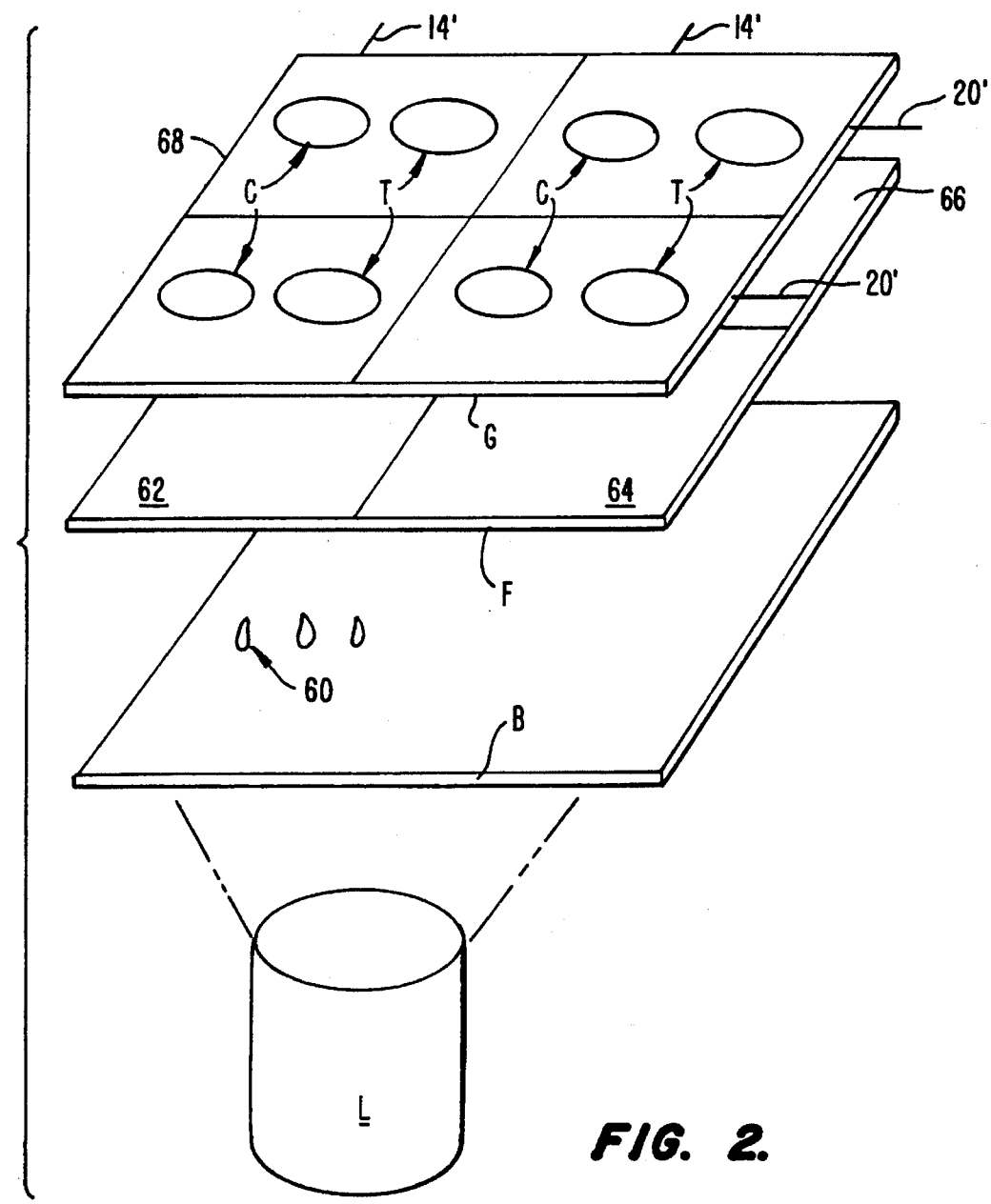
FIG. 2 is a schematic of a representative pixel in a flat panel display fabricated in accordance with this invention.

Referring to FIG. 2, flat panel display D is schematically illustrated. Light source L back illuminates backing plate B, color filter plate F and glass substrate G. Color filter plate F includes respective pigmented blue section 62, green section 64, and red section 66. White section 68 is hidden from view. Strobing of the illustrated pixel section occurs through connectors 14' and 20' to aluminum strip 14 and indium tin oxide layer 20. These respective connections enable charging of capacitor C with thin film transistor T of the appropriate pixel segment being turned to the "on" condition.

Such an "on" condition causes liquid crystal particles 60 to transmit. The result is that the illustrated pixel will illuminate in the respective chosen color (or white).

Figure 3:
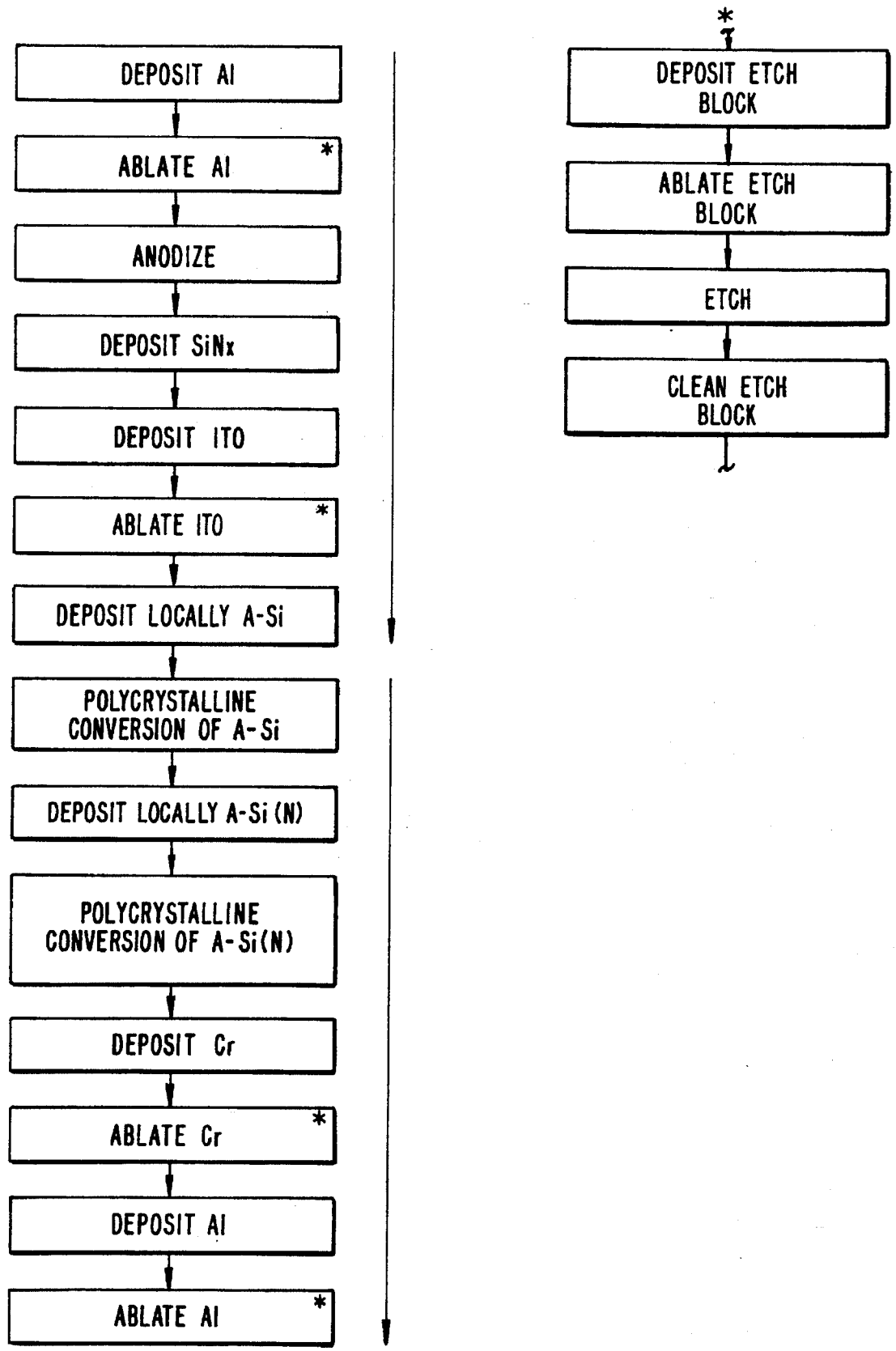
FIG. 3 is a block diagram representative of the number of steps required for fabrication of the flat panel display of this invention.

Having summarized the operation and construction of the flat panel display, attention can now be devoted to the process of construction. In following this description, the readers attention is directed to FIG. 3 wherein the steps involved are schematically represented. The reader will note that each time direct ablation is required, two types of ablation can occur.

The first type of ablation is the direct ablation of the deposited material. This is simple and preferred.

The second type of ablation is the deposit of etch block, ablation of the etch block, a suitable etch (for example wet or dry) followed by cleaning of the etch block. Generally, this latter technique is preferred where relatively thick layers of material are encountered. For example, the aluminum layers are good candidates for the use of direct laser ablation of etch block.

In either case there results a vast simplification over photolithography.

Figure 4A:
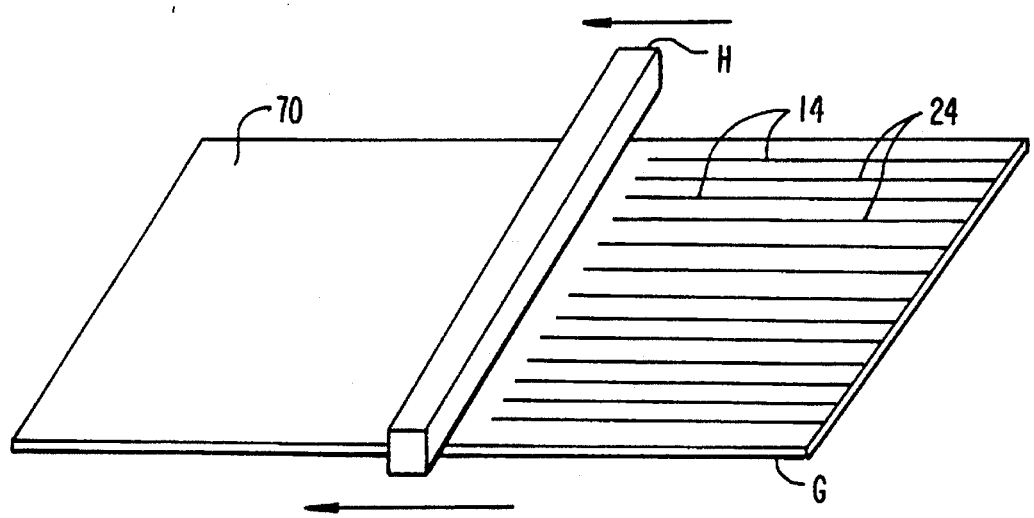
FIG. 4A–4D is a cartoon series illustrating respectively.

Referring to FIG. 4A, laser head H is shown passing over glass substrate G having one micron thick aluminum layer 70. Direct etching occurs with respective aluminum strip 14 and aluminum strip 24 left crossing glass substrate G. As will be remembered, these respective aluminum strip 14 and aluminum strip 24 communicate power to capacitor C and thin film transistor T.

The reader will understand that laser head H is a convenient schematic for more complicated apparatus. For example, such apparatus is disclosed and set forth in co-pending Smith et al. U.S. patent application Ser. No. 08/121,060 entitled APPARATUS AND PROCESS FOR USING FRESNEL ZONE PLATES FOR PRODUCING MATERIALS (now U.S. Pat. No. 5,481,407 issued Jan. 2, 1996), which reference is incorporated by reference into this disclosure.

It will be understood that we illustrate here a direct laser etch. It will be understood that aluminum layer 70 could be covered with an etch block, directly ablated with laser energy and thereafter wet or dry etched.

It will be understood that we have previously disclosed this technique. Attention is directed to APPARATUS AND PROCESS FOR THE PRODUCTION OF FINE LINE METAL TRACES, U.S. patent application Ser. No. 08/058, 906 filed May 6, 1993, now U.S. Pat. No. 5,364,493 issued Nov. 15, 1994.

Figure 4B:
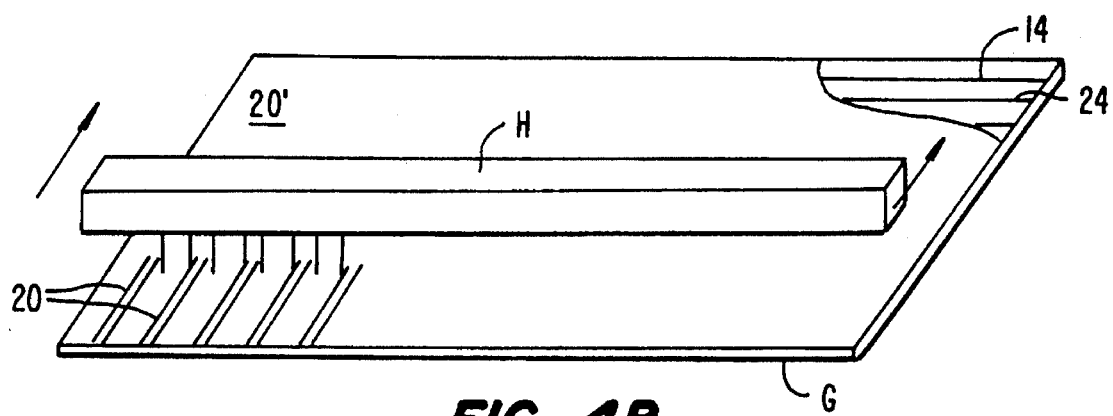

Referring to FIG. 4B, glass substrate G is covered with indium tin oxide layer 20'. Thereafter, it is processed with laser head H to leave indium tin oxide layer 20 in the strip format. It will be observed that these respective strips 20 run at right angles to aluminum strips 14, 24, permitting convenient strobing of the construction.

Having essentially completed capacitor C, attention can now be directed to completing the construction of thin film transistor T.

The reader will understand that it is now possible to locally deposit from a gas amorphous silicon. See "Low-Temperature Growth of Polycrystalline Si and Ge Films by Ultraviolet Laser Photodissociation of Silane and Germane" by Andreatta, Abele, Osmundsen, Eden, Lubben, and Green in *Applied Physics Letters* 40(2), 15 Jan. 1982, pp 183–185 and "Laser-assisted Chemical Vapor Deposition of Si: Low-temperature (<600° C.) growth of epitaxial and polycrystalline layers" by Suzuki, Lubben, and Green in *Journal of Applied Physics* 58(2), 15 Jul. 1985.

Figure 4C:
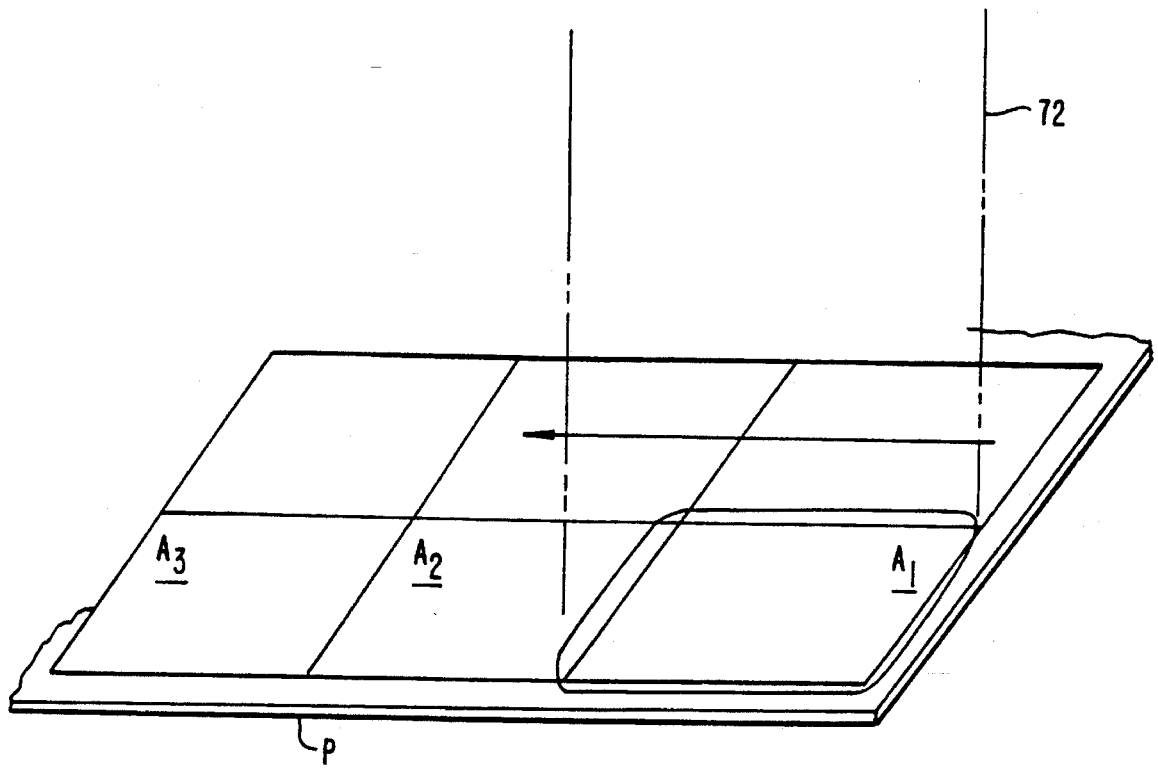
Figure 4C:
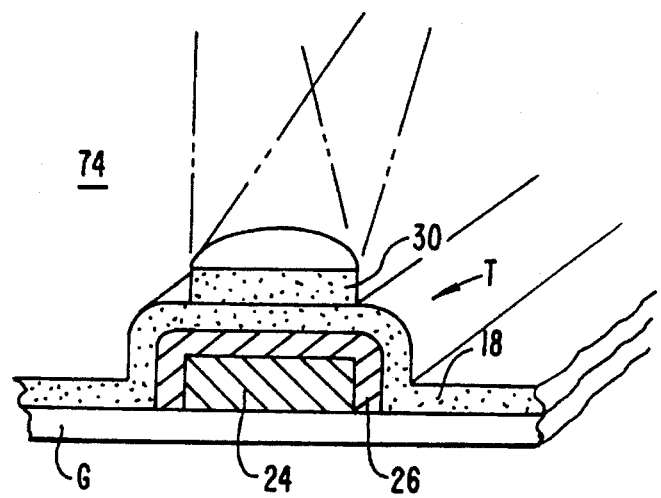

Accordingly, and referring to FIG. 4C, pulsed laser irradiation I (248-nm or 5-eV photons) is incident on thin film transistor T in $SiH_4$ gas mixture 72. A complete explanation of this schematic can be of assistance to the reader.

Laser beam 72 scans fresnel zone subaperture plate P at subapertures $A_1$–$A_3$. It will be understood that only a small portion of fresnel zone subaperture plate P is here shown. Each subaperture $A_1$–$A_3$ contains two types of image information. First, the subaperture establishes the distance of an image from fresnel zone subaperture plate P. Secondly, the subaperture contains the image information for the image from the subaperture. In this case, an image is produced which optimally produces amorphous deposition from the coherent light image within $SiH_4$ gas mixture 74. Here that image is illustrated as disc shaped, that is in the same shape as the desired deposition of polycrystalline silicon transisting material 30. Accelerated local deposition of amorphous silicon results.

Regarding focus of such a beam, techniques for such focus are well known. See for example, MacDonald et al. U.S. Pat. No. 5,362,940 issued Nov. 8, 1994 entitled USE OF FRESNEL ZONE PLATES FOR MATERIALS PROCESSING. In this patent at FIG. 2, a so-called holographic sub-aperture plate is illustrated. These subapertures are active in coherent light and function both to focus and produce an image at the focus of the plate.

It will be understood that one of the advantages of the above illustrated scheme is that images for reproducing deposition of polycrystalline silicon transisting material 30 can be reproduced on a small compacted scale. This being the case, local deposition is possible on a minute scale. Further, by having a following subapertures produce bounding images, silicon transisting material deposited in adjacent regions can be ablated away. In short, fresnel zone subaperture plate P in combination with laser assisted chemical vapor deposition enables precise deposition on a small center-to-center scale required by flat panel displays.

It will be further noted that such deposition is not always polycrystalline. Further heat must frequently be applied to change the deposited silicon from the amorphous state to the polycrystalline state. Again, the precise imaging characteristics of fresnel zone subaperture plate P can be utilized to achieve this result. In short, both deposition and achievement of the polycrystalline state can all occur with direct laser treatment through the illustrated subaperture plates. In this case, the illustrated FIG. 4C can be understood to apply to the already deposited silicon transisting material 30 sufficient heat to convert the silicon transisting material to the polycrystalline state.

Figure 4D:
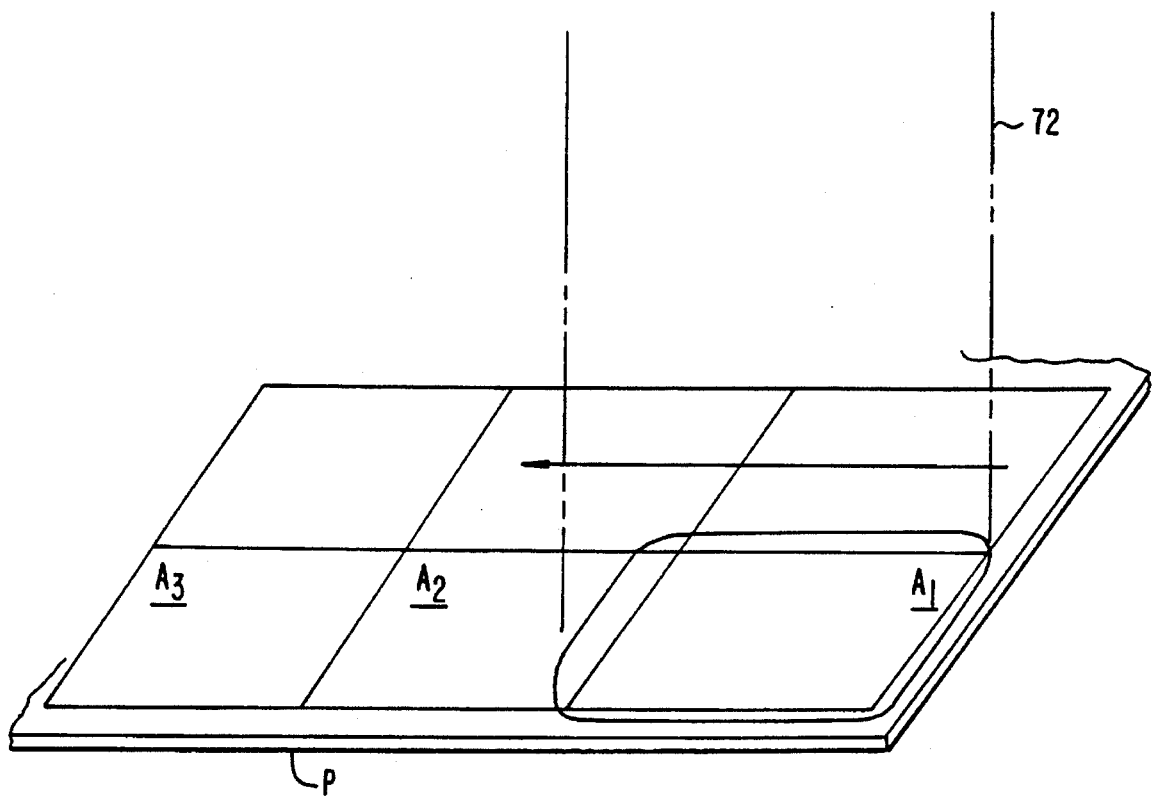
Figure 4D:
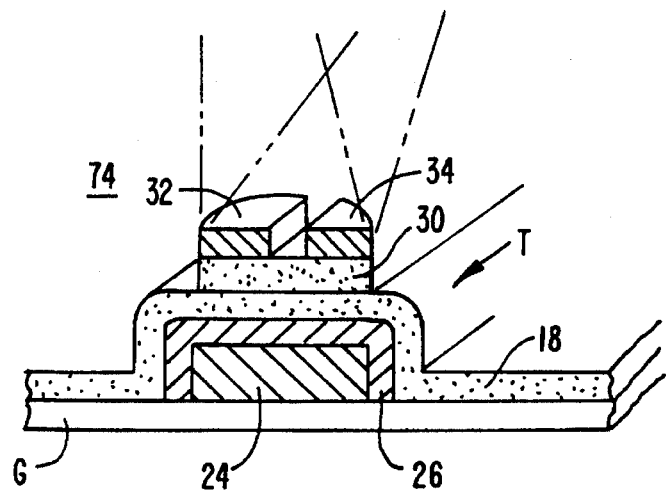

Referring to FIG. 4D, an additional advantage of the deposit of N-doped silicon layers 32 and 34 is illustrated. Specifically, the image from fresnel zone subaperture plate P at subaperture $A_1$ is now the channel divided cylindrical wafer image required for the deposition of N-doped silicon layers 32 and 34. Again, and where unwanted deposition occurs in gap 36, laser ablation from subsequent subapertures can be utilized to maintain gap 36. Further, and as before, subsequent laser treatment from subapertures can be utilized to change the state of the silicon from amorphous to polycrystalline.

The reader will understand that we contemplate the remaining deposition and ablation steps to be previously disclosed herein. Deposition of conductive chrome layer 39 and capping aluminum strip 50 can proceed as previously described.

It will be understood that the techniques herein set forth are exemplary. It will be understood that we disclose a fabrication process for a flat panel display which is entirely either direct laser ablation or deposition of an etch block, ablation of the etch block, followed by the appropriate wet or dry etch. In either case, we substitute for present multi-step photolithographic techniques direct laser ablation. Accuracy, repeatability, reduced cost, and increased yield result.

What is claimed is:

1. A process for forming an active matrix flat panel display including strobed capacitors controlling switched transistors for polarizing liquid suspended crystals to light transmitting alignment, the process utilizing direct laser ablation comprising the steps of:

providing a glass substrate;

depositing and ablating metallic channels on the glass substrate for providing power to the capacitors and transistors;

depositing an insulating layer overlying the metallic channels and glass substrate;

depositing and ablating metallic channels for strobing the capacitors to maintain connected transistors in a switch state responsive to the capacitors;

providing a gas atmosphere having a suspended transisting material;

locally applying an image overlying the transistors for photo assisted deposition of transisting material;

depositing the transisting material;

locally heating the transisting material to a polycrystalline switch state; and, depositing and ablating a layer to enable the transisting material to be supplied with power for switching through the transistor responsive to charge at the capacitor.

2. A process for forming an active matrix flat panel display according to claim 1 including the steps of:

deposited and ablated metallic channels on the glass substrate are aluminum.

3. A process for forming an active matrix flat panel display according to claim 1 including the steps of:

the deposited insulating layer over the metallic channels include anodized aluminum.

4. A process for forming an active matrix flat panel display according to claim 1 including the steps of:

the deposited and ablated metallic channels for strobing the capacitors includes indium tin oxide.

5. A process for forming an active matrix flat panel display according to claim 1 including the steps of:

at least one of the ablating steps includes applying a layer of etch block;

directly ablating the etch block;

etching underlying the ablated area of the etch block; and, stripping the remaining etch block.

6. A process for forming an active matrix flat panel display according to claim 1 wherein the step of locally applying an image overlying the transistor includes:

providing a fresnel zone plate having subapertures with at least one of the subapertures having image and focus information for producing an image for optimum photodeposit of transisting material; and, scanning said fresnel zone plate at the subapertures to produce the image.

7. A process for forming an active matrix flat panel display including strobed capacitors controlling switched transistors for polarizing liquid suspended crystals to light transmitting alignment, the process utilizing direct laser ablation comprising the steps of:

providing a glass substrate;

depositing and ablating metallic channels on the glass substrate for providing power to the capacitors and transistors;

depositing an insulating layer overlying the metallic channels and glass substrate;

depositing and ablating metallic channels for strobing the capacitors to maintain connected transistors in a switch state responsive to the capacitors;

providing a gas atmosphere having a suspended transisting material;

locally depositing the transisting material overlying the transistor;

locally heating the transisting material to a polycrystalline switch state; and, depositing and ablating a layer to enable the transisting material to be supplied with power for switching through the transistor responsive to charge at the capacitor.

8. A process for forming an active matrix flat panel display according to claim 7 wherein the step of locally depositing the transisting material overlying the transistor includes the steps of:

providing a holographic image overlying the transistor; and, depositing transisting material from a gas containing the transisting material through photo assisted deposition.

* * * * *